US008924801B2

(12) United States Patent  
Tekumalla et al.

(10) Patent No.: US 8,924,801 B2
(45) Date of Patent: Dec. 30, 2014

(54) AT-SPEED SCAN TESTING OF INTERFACE FUNCTIONAL LOGIC OF AN EMBEDDED MEMORY OR OTHER CIRCUIT CORE

(71) Applicant: LSI Corporation, San Jose, CA (US)

(72) Inventors: Ramesh C. Tekumalla, Breinigsville, PA (US); Prakash Krishnamoorthy, Bethlehem, PA (US)

(73) Assignee: LSI Corporation, Milpitas, CA (US)

( * ) Notice: Subject to any disclaimer, the term of this patent is extended or adjusted under 35 U.S.C. 154(b) by 102 days.

(21) Appl. No.: 13/767,467

(22) Filed: Feb. 14, 2013

(65) Prior Publication Data

US 2014/0229778 A1 Aug. 14, 2014

(51) Int. Cl.
*G01R 31/28* (2006.01)
*G01R 31/3177* (2006.01)

(52) U.S. Cl.
CPC .................................. *G01R 31/3177* (2013.01)
USPC .............. 714/726; 714/727; 714/729; 714/30

(58) Field of Classification Search
None
See application file for complete search history.

(56) References Cited

U.S. PATENT DOCUMENTS

| | | | | |
|---|---|---|---|---|
| 5,592,493 | A * | 1/1997 | Crouch et al. ................. | 714/729 |
| 5,761,215 | A | 6/1998 | McCarthy et al. | |
| 5,774,476 | A * | 6/1998 | Pressly et al. ................. | 714/726 |
| 6,341,092 | B1 * | 1/2002 | Agrawal ........................ | 365/201 |
| 7,779,316 | B2 | 8/2010 | Parulkar et al. | |
| 7,831,876 | B2 | 11/2010 | Goyal et al. | |
| 2002/0091979 | A1 * | 7/2002 | Cooke et al. .................. | 714/733 |
| 2005/0096876 | A1 * | 5/2005 | Jang et al. ..................... | 702/185 |
| 2007/0266278 | A1 * | 11/2007 | Nadeau-Dostie et al. .... | 714/719 |
| 2008/0004831 | A1 | 1/2008 | Li | |
| 2008/0126897 | A1 | 5/2008 | Pandey | |
| 2008/0256405 | A1 * | 10/2008 | Eustis et al. .................. | 714/726 |
| 2009/0116323 | A1 | 5/2009 | Gerowitz et al. | |
| 2010/0037109 | A1 * | 2/2010 | Nadeau-Dostie et al. .... | 714/719 |
| 2012/0331362 | A1 | 12/2012 | Tekumalla | |

FOREIGN PATENT DOCUMENTS

| | | |
|---|---|---|
| CA | 2307535 A1 | 11/2000 |
| WO | 2004074852 A2 | 9/2004 |

OTHER PUBLICATIONS

V.R. Devanathan et al., "Towards Effective and Compression-Friendly Test of Memory Interface Logic," IEEE International Test Conference (ITC), Nov. 2010, pp. 1-10.*
G. Seok et al., "Write-Through Method for Embedded Memory with Compression Scan-Based Testing," IEEE 30th VLSI Test Symposium (VTS), Apr. 2012, pp. 158-163, Maui, Hawaii, USA.

(Continued)

*Primary Examiner* — John Trimmings
(74) *Attorney, Agent, or Firm* — Sheridan Ross P.C.

(57) ABSTRACT

An integrated circuit comprises scan test circuitry and at least one circuit core coupled to the scan test circuitry. The scan test circuitry comprises input and output scan chains coupled to respective input and output interfaces of the circuit core via respective functional logic blocks, and interface signal selection circuitry. The interface signal selection circuitry is configured to select a particular one of a functional input signal and a plurality of scan test input signals for application to one or more designated input signal lines of the input interface of the circuit core responsive to one or more control signals. By way of example only, the first and second scan test input signals may comprise respective first and second distinct address values and the designated input signal lines of the input interface of the circuit core may comprise address input signal lines of an embedded memory.

20 Claims, 10 Drawing Sheets

(56) References Cited

OTHER PUBLICATIONS

S.K. Jain et al., "A Novel Circuit to Optimize Access Time and Decoding Schemes in Memories," 23rd International Conference on VLSI Design, 9th International Conference on Embedded Systems, Jan. 2010, pp. 117-121, Bangalore, India.

S. Hamdioui et al., "Scan More with Memory Scan Test," IEEE 4th International Conference on Design & Technology of Integrated Systems in Nanoscale Era, Apr. 2009, pp. 204-209, Cairo, Egypt.

L.-C. Chen et al., "Transition Test on UltraSPARCTM T2 Microprocessor," IEEE International Test Conference (ITC), Oct. 2008, pp. 1-10.

V. Zolotov et al., "Voltage Binning Under Process Variation," IEEE/ACM International Conference on Computer-Aided Design (ICCAD)—Digest of Technical Papers, Nov. 2009, pp. 425-432.

U.S. Appl. No. 13/445,308, filed in the name of Ramesh C. Tekumalla et al. on Apr. 12, 2012 and entitled "Scan-Based Capture and Shift of Interface Functional Signal Values in Conjunction with Built-In Self-Test."

U.S. Appl. No. 13/165,284, filed in the name of Ramesh C. Tekumalla on Jun. 11, 2011 and entitled "Integrated Circuit Comprising Scan Test Circuitry with Controllable Number of Capture Pulses."

U.S. Appl. No. 13/280,797, filed in the name of Ramesh C. Tekumalla et al. on Oct. 25, 2011 and entitled "Dynamic Clock Domain Bypass for Scan Chains."

\* cited by examiner

AT-SPEED SCAN TESTING OF INTERFACE FUNCTIONAL LOGIC OF AN EMBEDDED MEMORY OR OTHER CIRCUIT CORE

FIELD

The field relates generally to integrated circuits, and more particularly to scan testing of integrated circuits.

BACKGROUND

Integrated circuits are often designed to incorporate scan test circuitry that facilitates testing for various internal fault conditions. Such scan test circuitry typically comprises scan chains comprising multiple scan cells. The scan cells may be implemented, by way of example, utilizing respective flip-flops. The scan cells of a given scan chain are configurable to form a serial shift register for applying test patterns at inputs to combinational logic of the integrated circuit. The scan cells of the given scan chain are also used to capture outputs from other combinational logic of the integrated circuit.

Scan testing of an integrated circuit may therefore be viewed as being performed in two repeating phases, namely, a scan shift phase in which the flip-flops of the scan chain are configured as a serial shift register for shifting in and shifting out of test patterns, and a scan capture phase in which the flip-flops of the scan chain capture combinational logic outputs. These two repeating scan test phases may be collectively referred to herein as a scan test mode of operation of the integrated circuit, or as simply a scan mode of operation. Outside of the scan test mode and its scan shift and scan capture phases, the integrated circuit may be said to be in a functional mode of operation. Other definitions of the scan test and functional operating modes may also be used.

An integrated circuit may also be configured to include built-in self-test (BIST) capabilities. Such BIST capabilities in some implementations make use of scan test circuitry and operating modes of the type described above. BIST implementations may be configured to test particular portions of an integrated circuit, such as a memory. BIST testing of integrated circuit memories is also referred to as memory BIST (MBIST). MBIST is typically used to detect faults that are internal to the memory. However, conventional MBIST arrangements are unable to detect faults associated with functional data and address paths at the memory interface. This is because the data and address inputs applied during MBIST are provided to the memory interface by an MBIST controller, with the functional data and address paths bypassed. Undetected faults associated with these functional paths at the memory interface can cause the integrated circuit to fail in the field.

SUMMARY

In one embodiment, an integrated circuit comprises scan test circuitry and at least one circuit core coupled to the scan test circuitry. The scan test circuitry comprises input and output scan chains coupled to respective input and output interfaces of the circuit core via respective functional logic blocks, and interface signal selection circuitry. The interface signal selection circuitry is configured to select a particular one of a functional input signal and a plurality of scan test input signals for application to one or more designated input signal lines of the input interface of the circuit core responsive to one or more control signals.

By way of example only, the first and second scan test input signals may comprise respective first and second distinct address values and the designated input signal lines of the input interface of the circuit core may comprise address input signal lines of an embedded memory.

Other embodiments of the invention include but are not limited to methods, apparatus, systems, processing devices and computer-readable storage media having computer program code embodied therein.

DETAILED DESCRIPTION

The invention will be illustrated herein in conjunction with exemplary integrated circuits comprising scan test circuitry for supporting scan testing of other internal circuitry of those integrated circuits. It should be understood, however, that the invention is more generally applicable to any integrated circuit in which it is desirable to provide improved testing of functional logic associated with an interface of a memory or other internal circuit core of the integrated circuit. For example, the disclosed techniques can be adapted for application to testing of integrated circuits that comprise stand-alone memory devices, such as RAM, ROM or Flash memory integrated circuits, which may additionally or alternatively include multi-level memory integrated circuits.

Figure 1:
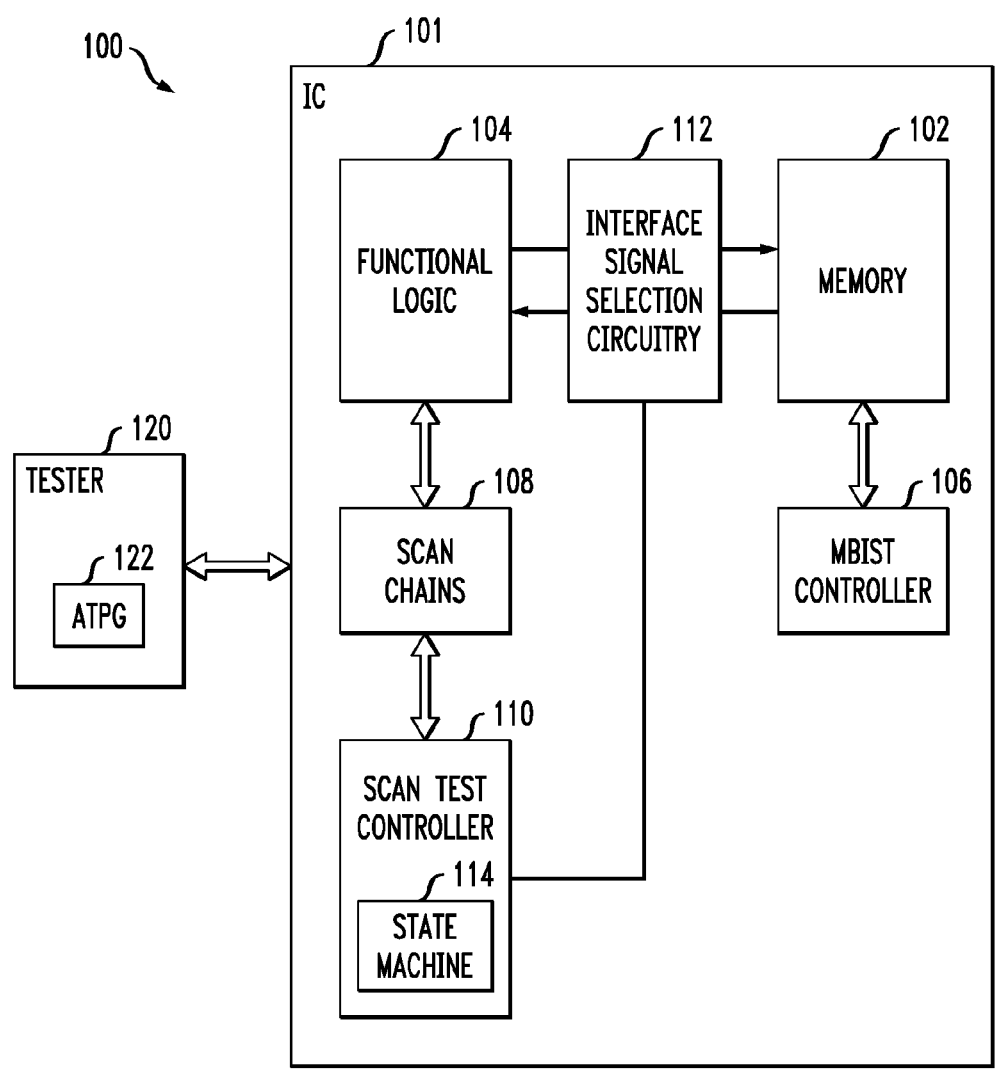
FIG. 1 is a block diagram of a testing system comprising a tester and an integrated circuit configured for at-speed scan testing of interface functional logic associated with an embedded memory in one embodiment.

FIG. 1 shows an embodiment of the invention in which a testing system 100 comprises an integrated circuit under test 101. The integrated circuit 101 comprises an embedded memory 102 and associated interface functional logic 104. An MBIST controller 106 is coupled to embedded memory 102 for performing conventional MBIST testing of the embedded memory using techniques that are known to those skilled in the art.

The integrated circuit 101 further comprises scan test circuitry which in this embodiment includes scan chains 108, a scan test controller 110, and interface signal selection circuitry 112. This exemplary scan test circuitry is configured to provide at-speed scan testing of read and write functional paths that encompass portions of the interface functional logic 104 that would otherwise not be covered using the above-noted conventional MBIST testing of the embedded memory 102.

The integrated circuit 101 is coupled to a tester 120 that comprises an automatic test pattern generator (ATPG) 122. The ATPG may be viewed as an example of what is more generally referred to herein as a test generation tool.

The tester 120 stores scan data associated with scan testing of the integrated circuit 101. Such scan data comprises input test patterns provided by the ATPG 122 for shifting into the scan chains 108 as well as corresponding output scan data shifted out of the scan chains 108 and resulting from application of the input test patterns to the integrated circuit 101. In other embodiments, at least a portion of the tester 120, such as the ATPG 122, may be incorporated into the integrated circuit 101. Alternatively, the entire tester 120 may be incorporated into the integrated circuit 101, in an embodiment that implements scan testing as part of a BIST arrangement.

Embodiments of the present invention may be configured to utilize compressed or noncompressed scan testing implemented via the exemplary scan test circuitry comprising scan chains 108, scan test controller 110 and interface signal selection circuitry 112. Accordingly, scan test circuitry in one or more embodiments may further comprise a decompressor for decompressing compressed scan patterns to be applied to the scan chains 108, and a compressor for compressing scan chain outputs received from the scan chains 108. Additional details regarding compressed scan testing are disclosed in U.S. Pat. No. 7,831,876, entitled "Testing a Circuit with Compressed Scan Subsets," which is commonly assigned herewith and incorporated by reference herein.

In an embodiment using compressed scan testing, the scan chains 108 are generally arranged in parallel with one another between respective outputs of the decompressor and respective inputs of the compressor, such that in a scan shift phase of the scan test mode of operation, scan test input data from the decompressor is shifted into the scan chains 108 and scan test output data is shifted out of the scan chains 108 into the compressor. However, such decompressor and compressor elements should not be viewed as requirements of any embodiment of the invention.

One or more embodiments of the invention may utilize scan capture clock signals having a controllable number of capture pulses, as described in U.S. patent application Ser. No. 13/165,284, filed Jun. 21, 2011 and entitled "Integrated Circuit Comprising Scan Test Circuitry with Controllable Number of Capture Pulses," which is commonly assigned herewith and incorporated by reference herein. For example, arrangements disclosed therein allow the number of capture pulses of a scan capture clock signal to vary in real time depending upon the particular test patterns being applied to functional logic via one or more scan chains, thereby facilitating full coverage of functional paths not covered by conventional MBIST testing. Other exemplary scan testing techniques that may be utilized in conjunction with one or more embodiments of the present invention are disclosed in U.S. patent application Ser. No. 13/445,308, filed Apr. 12, 2012 and entitled "Scan-Based Capture and Shift of Interface Functional Signal Values in Conjunction with Built-In Self-Test," which is also commonly assigned herewith and incorporated by reference herein.

It is therefore to be appreciated that the particular configuration of testing system 100 comprising integrated circuit 101 and tester 120 as shown in FIG. 1 is exemplary only, and the testing system 100 in other embodiments may include other elements in addition to or in place of those specifically shown, including one or more elements of a type commonly found in a conventional implementation of such a system. For example, various elements of the integrated circuit 101, tester 120 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Thus, the integrated circuit 101 need not include an embedded memory such as memory 102, and the functional logic 104 in the present embodiment may be replaced with other types of additional circuitry subject to testing utilizing the scan test circuitry 108, 110 and 112 of the integrated circuit 101.

For example, the memory 102 in the integrated circuit 101 of FIG. 1 may be replaced with any other type of circuit core that has at least one functional interface not covered by conventional MBIST testing. More particularly, circuit cores in another embodiment may comprise respective read channel and additional cores of a system-on-chip (SOC) integrated circuit in a hard disk drive (HDD) controller application, designed for reading and writing data from one or more magnetic storage disks of an HDD. In other embodiments, the circuit cores subject to interface testing by the scan chains may comprise other types of functional logic circuitry, in any combination. The term "circuit core" as used herein is therefore intended to be broadly construed.

The integrated circuit 101 may be configured for installation on a circuit board or other mounting structure in a computer, server, mobile telephone or other type of communication device. Such communication devices may also be viewed as examples of what are more generally referred to herein as "processing devices." The latter term is also intended to encompass storage devices, as well as other types of devices comprising data processing circuitry.

Figure 2:
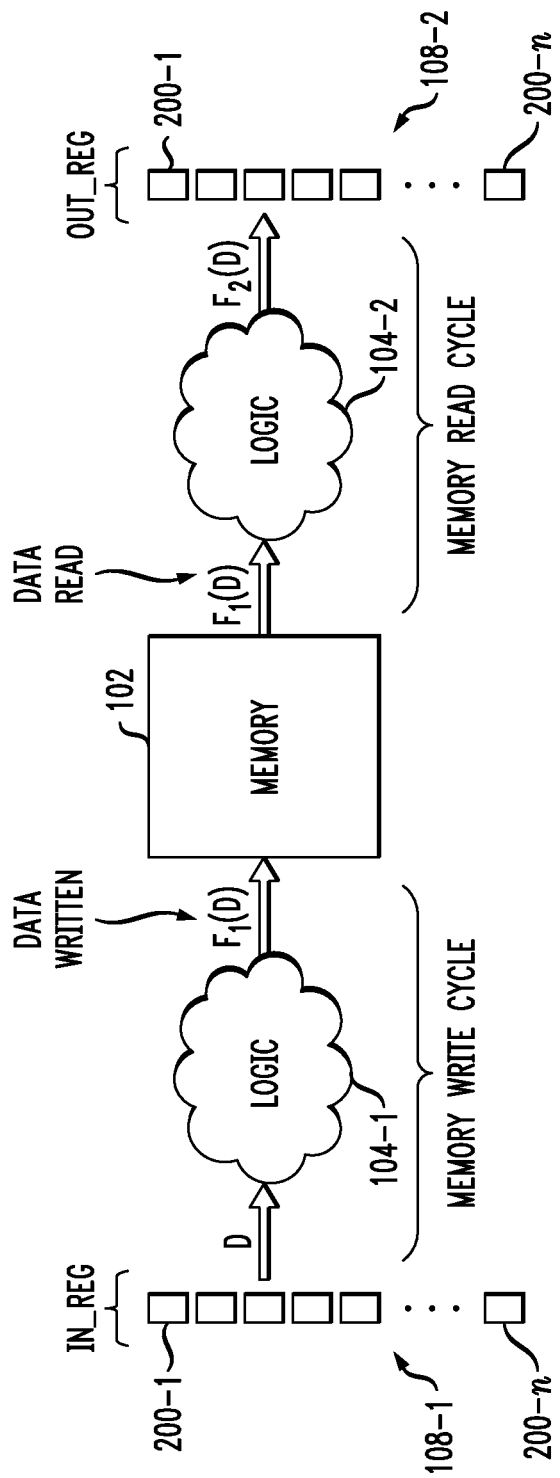
FIG. 2 shows a more detailed view of portions of the integrated circuit of FIG. 1.

Referring now to FIG. 2, portions of one potential configuration of the integrated circuit 101 are shown in greater detail. As illustrated, the embedded memory 102 in this embodiment has a write interface that is driven by functional logic 104-1 and a read interface that drives functional logic 104-2. The scan chains 108 of the integrated circuit 101 more particularly include at least two scan chains 108-1 and 108-2, also referred to as an input scan chain and an output scan chain, respectively, with each scan chain comprising n scan cells that are denoted 200-1 through 200-$n$. Other embodiments may include more scan chains, and all such chains need not have the same number of scan cells. Each scan cell may be configured to include, for example, a data input, a data output, a scan input, a scan output, a scan enable input, a clock input and a reset input, although other arrangements of scan cell inputs and outputs may be used in other embodiments. For example, a given scan cell may be configured such that a single data output may be used as both a data output in functional mode and as a scan output in scan test mode.

In this embodiment, the functional logic 104-1 is arranged between the input scan chain 108-1 and the memory 102, and the functional logic 104-2 is arranged between the memory 102 and the output scan chain 108-2. The interface signal selection circuitry 112 is omitted from this figure, but portions of that circuitry may be arranged between the functional logic 104-1 and the memory 102, and between the memory 102 and the functional logic 104-2. The functional logic 104-1 and 104-2 are examples of what are more generally referred to herein as "functional logic blocks" of functional logic 104. The input and output scan chains 108-1 and 108-2 are coupled to respective input and output interfaces of the memory 102 via these respective functional logic blocks.

The functional logic 104 is an example of what is more generally referred to herein as "additional circuitry" of integrated circuit 101 that is subject to scan testing utilizing the scan test circuitry of integrated circuit 101. In other embodiments, the particular circuit blocks subject to testing by the scan test circuitry may comprise other types of functional logic circuitry, in any combination, and the term "additional circuitry" is intended to be broadly construed so as to cover any such arrangements of logic circuitry.

The input and output scan chains 108-1 and 108-2 are configurable to operate as respective serial shift registers in a scan shift phase of the scan test mode of operation of the integrated circuit 101. In the scan test mode, the input scan chain 108-1 is used to apply input data signals to the input interface of the memory 102 via the functional logic 104-1, and the output scan chain 108-2 is used to collect output data signals from the output interface of the memory 102 via the functional logic 104-2. It should be noted in this regard that the input and output scan chains may be implemented as respective sub-chains of a single larger scan chain. Scan data corresponding to test patterns from the ATPG 122 are shifted into and out of the scan chains 108 in a scan shift phase of the scan test mode.

The scan chains 108-1 and 108-2 are also referred to herein as IN_REG and OUT_REG, respectively. The scan chains 108 in the FIG. 2 embodiment are shown without any other intervening elements between the scan cells 200 of a given chain, but it should be understood that a scan chain may comprise other logic elements such as slave elements, latches, buffers, inverters or other elements arranged between adjacent scan cells in the chain. The term "scan chain" as used herein is intended to encompass such arrangements.

The scan chains 108-1 and 108-2 are also operative to capture functional data in a capture phase of the scan test mode of operation of the integrated circuit 101. The scan chains may therefore also be coupled to respective primary inputs and primary outputs of the integrated circuit. For example, data inputs of the scan cells of the scan chain 108-1 may be coupled to primary inputs of the integrated circuit, and data outputs of the scan cells of the scan chain 108-2 may be coupled to primary outputs of the integrated circuit, although these connections are not expressly shown in the figure. Additional details regarding the operation of scan chains in scan test and functional modes of an integrated circuit may be found in the above-cited U.S. Pat. No. 7,831,876.

A scan shift control signal is utilized to cause the scan cells 200 of a given one of the scan chains 108 to form a serial shift register during scan testing. The scan shift control signal may comprise, for example, a scan enable (SE) signal, such that the scan cells of the given scan chain form the serial shift register responsive to the SE signal being at a first designated logic level (e.g., a logic "1" level) and the scan cells capture functional data when the SE signal is at a second designated logic level (e.g., a logic "0" level). A single SE signal may be used to control all of the scan chains 108, or only a subset of those scan chains, with the remaining scan chains being controlled using one or more other SE signals.

The SE signal in the present embodiment controls configuration of scan cells of a scan chain to form a serial shift register for shifting in and shifting out of scan test data associated with one or more test patterns applied by the tester 120. The SE signal may therefore be considered a type of scan shift enable signal, or more generally, a type of scan shift control signal.

When the scan chains 108 are configured to form respective serial shift registers for shifting in and shifting out scan test data associated with one or more test patterns applied by the tester 120, the scan test circuitry may be said to be in a scan shift phase of a scan test mode of operation. It should be appreciated, however, that a wide variety of other types of scan shift control signals and sets of integrated circuit operating modes and phases may be used in other embodiments. These embodiments therefore do not require the use of any particular definition of operating modes and phases.

The scan chains 108 may be associated with multiple distinct clock domains, or a single clock domain. It will be assumed in some embodiments that at least one of the scan chains 108 is a multiple clock domain scan chain, that is, a scan chain comprising sub-chains associated with respective distinct clock domains. Such sub-chains of a multiple clock domain scan chain may be separated from one another by lockup latches. Also, one or more of the sub-chains may be selectively bypassed using clock domain bypass circuitry so as to not be part of the serial shift register formed by the scan chain in the scan shift phase. For example, such clock domain bypass circuitry may be configured to bypass one or more of the sub-chains that are determined to be inactive for a particular test pattern, and the clock domain bypass circuitry may bypass different ones of the sub-chains for different test patterns. Additional details regarding clock domain bypass circuitry that may be utilized in embodiments of the invention may be found in U.S. patent application Ser. No. 13/280,797, filed Oct. 25, 2011 and entitled "Dynamic Clock Domain Bypass for Scan Chains," which is commonly assigned herewith and incorporated by reference herein.

As noted above, techniques for MBIST testing of embedded memory in an integrated circuit would typically involve bypassing certain functional paths going into and out of the embedded memory, such that no test coverage is provided for interface functional logic associated with these paths.

The scan test controller 110 in the present embodiment is configured to address this issue by controlling interface signal selection circuitry 112 in accordance with state machine 114. As will be described in greater detail below, such an arrangement facilitates scan testing of the functional logic 104-1 and 104-2 that would not otherwise be covered by MBIST testing implemented using MBIST controller 106. For example, such an arrangement allows the functional logic to be tested using at-speed clocks, such that the test environment closely tracks the functional operating environment. Embodiments of the interface signal selection circuitry 112 and state machine 114 will be described below in conjunction with FIGS. 5 and 6, respectively.

In the present embodiment as illustrated in FIG. 2, at-speed scan testing is performed for both write and read functional paths through respective functional logic 104-1 and 104-2. The input scan chain 108-1 serves as a source of scan test data for memory writes and the output scan chain 108-2 serves as a destination of scan test data for memory reads. As mentioned previously, these input and output scan chains are also referred to herein as IN_REG and OUT_REG, respectively.

The data D emerging from input scan chain 108-1 is transformed by the function $F_1$ in the functional logic 104-1 and arrives as data $F_1(D)$ at the write data input of the memory 102. Similarly, data $F_1(D)$ emerging from the read data output of the memory 102 is transformed by the function $F_2$ in the functional logic 104-2 and arrives as data $F_2(D)$ at the output scan chain 108-2.

The memory 102 may comprise a dual-port memory or a single-port memory, or a combination of multiple memories of these and other types.

Figure 3:
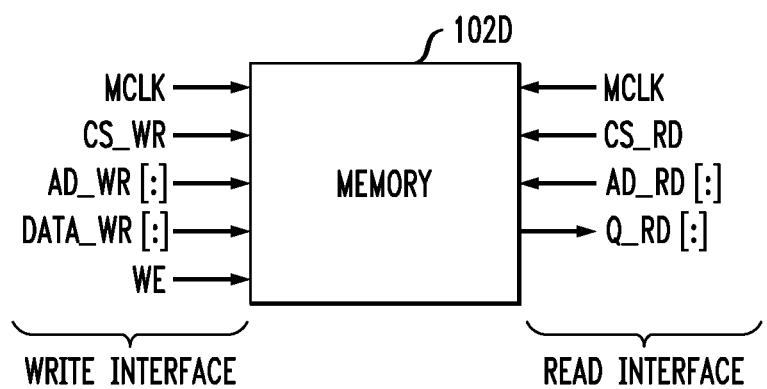
FIGS. 3 and 4 illustrate exemplary interface configurations of respective dual-port and single-port embodiments of the integrated circuit memory of FIGS. 1 and 2.

FIG. 3 shows one possible interface configuration for a dual-port embodiment of memory 102, which is more particularly designated as memory 102D in this embodiment. The interface of memory 102D comprises separate write and read interfaces each having a corresponding set of interface signal lines. The write and read interfaces are also referred to herein as respective read and write ports of the memory 102D.

The write interface includes a clock input MCLK, a write chip select input CS_WR, write address inputs AD_WR[:], write data inputs DATA_WR[:] and a write enable input WE. The read interface includes a clock input MCLK, a read chip select input CS_RD, read address inputs AD_RD[:] and read data outputs Q_RD[:]. The control signals for the write and read interfaces can be activated independently of each other, except that the read address cannot have the same value as the write address when memory writes and reads are performed concurrently. The input and output interface signal lines described above are also used herein to denote the corresponding signals. Thus, for example, MCLK may be used herein to denote a memory clock signal as well as the associated signal line.

Figure 4:
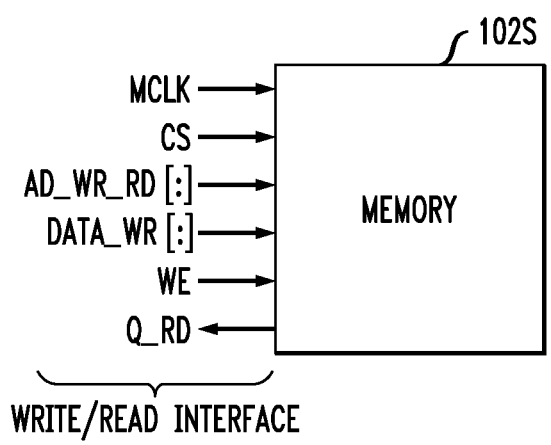

FIG. 4 shows one possible interface configuration for a single-port embodiment of memory 102, which is more particularly designated as memory 102S in this embodiment. The interface of memory 102S comprises a single write/read interface having a corresponding set of interface signal lines. The write/read interface is also referred to herein as a write/read port of the memory 102S.

The write/read interface includes a clock signal input MCLK, a chip select input CS, write/read address inputs AD_WR_RDM, write data inputs DATA_WR[:], a write enable input WE and read data outputs Q_RD M. Since the address inputs are shared by memory writes and reads, the write enable when asserted enables memory writes and when disabled enables memory reads. During memory reads, the read data outputs present the contents of address location AD_WR_RD and during memory writes, the read data outputs hold their respective values from the previous memory read. Again, the input and output interface signal lines described above are also used herein to denote the corresponding signals.

It is to be appreciated that memory 102 as illustrated in FIGS. 1 and 2 may comprise either dual-port memory 102D or single-port memory 102S. As noted above, it is also possible that memory 102 may be implemented as a combination of one or more dual-port memories and one or more single-port memories. Some complex integrated circuit designs may include a large number of different embedded memories, at least a subset of which may be of different sizes. For example, in one illustrative implementation of integrated circuit 101, there may be as many as 50 separate memories of different sizes.

Certain designated interface signal lines described above in the context of FIGS. 3 and 4 are controlled by the interface signal selection circuitry 112 while other interface signal lines are directly controlled and do not pass through the functional logic 104. For example, the memory clock, write enable and chip select signal lines in this embodiment are each assumed to be directly applied to the memory 102 from the tester 120 via dedicated input pins of the integrated circuit 101, such that the corresponding signals reach the memory 102 without passing through the functional logic 104 or the interface signal selection circuitry 112.

Also, the data input signal lines of the memory 102 receive input data from the input scan chain 108-1 via the functional logic 104-1 in the scan test mode of operation, and the data output signal lines of the memory 102 supply output data to the output scan chain 108-2 via the functional logic 104-2 in the scan test mode of operation.

In the present embodiment, it is only the address signal lines that are controlled by the interface signal selection circuitry 112. More particularly, the address signal lines receive either a functional signal in the functional mode of operation or one of two designated scan input signals, illustratively comprising respective distinct address values, during the scan test mode of operation.

Figure 5:
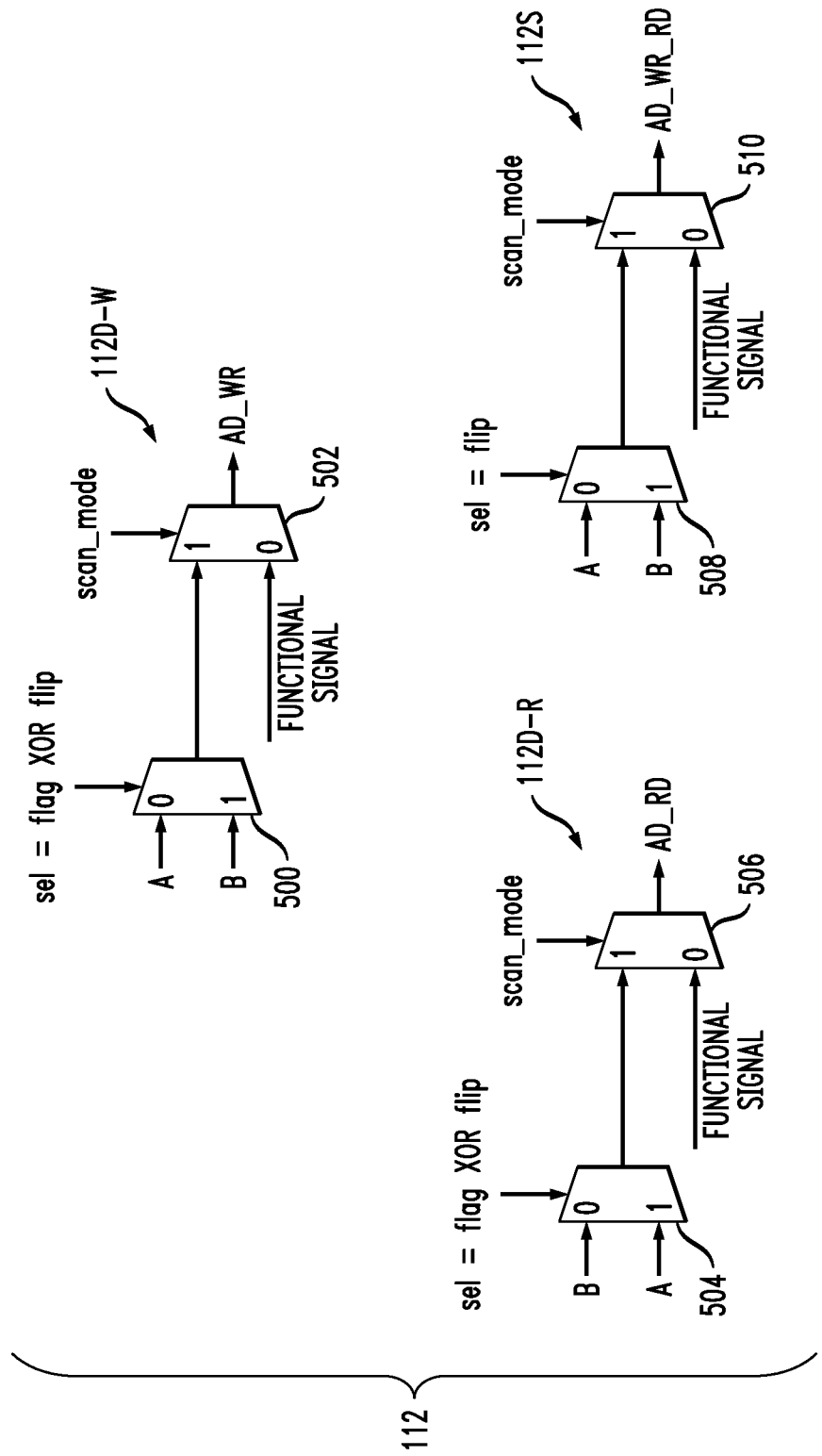
FIG. 5 illustrates portions of scan test circuitry comprising interface signal selection circuitry arranged between the functional logic and the embedded memory of the FIG. 1 integrated circuit.

As noted above, the interface signal selection circuitry 112 is shown in greater detail in FIG. 5. The exemplary interface signal selection circuitry 112 illustrated in this figure includes first circuitry 112D-W configured for selecting an input signal for application to write address input signal lines AD_WR in the case of a dual-port write, second circuitry 112D-R configured for selecting an input signal for application to read address input signal lines AD_RD in the case of a dual-port read, and third circuitry 112S configured for selecting an input signal for application to write/read address input signal lines AD_WR_RD in the case of a single-port write or read.

In an embodiment in which memory 102 comprises dual-port memory 102D, the interface signal selection circuitry 112 is assumed to include at least first circuitry 112D-W and second circuitry 112D-R. In an embodiment in which memory 102 comprises single-port memory 102S, the interface signal selection circuitry 112 is assumed to include at least third circuitry 112S. It is further assumed for subsequent description that the memory 102 comprises either dual-port memory 102D or single-port memory 102S, but not both a dual-port memory and a single-port memory.

Although not explicitly illustrated in FIGS. 1 and 2, it is also assumed that the scan test controller 110 or another part of the scan test circuitry of integrated circuit 101 comprises at least two test registers for holding respective distinct address values for use in at-speed scan testing of the interface functional logic 104. These two test registers and their corresponding stored address values are denoted A and B, respectively. The address values are written to the respective corresponding registers in conjunction with the start of the at-speed scan testing of the interface functional logic 104. Thus, the following description of interface signal selection circuitry 112 assumes that test register A stores address value A and test register B stores address value B, where the address values A and B represent distinct addresses denoted distinct storage locations in the memory 102.

The address values A and B are examples of what are more generally referred to herein as respective first and second scan test inputs, and other scan test inputs can be used in other embodiments. Also, although only two distinct address values A and B are used in this embodiment, other embodiments may be configured to select from a larger number of distinct address values or other scan test inputs.

The first circuitry 112D-W comprises first and second multiplexers 500 and 502. The first multiplexer 500 has a first input adapted to receive the address value A, and a second input adapted to receive the address value B. The second multiplexer 502 has a first input coupled to the output of the first multiplexer 500, and a second input adapted to receive a functional input signal.

The functional input signal in the present embodiment refers generally to an input signal that would ordinarily be applied to the corresponding input interface signal lines of the memory 102 during the functional mode of operation. It is also referred to herein as simply a "functional signal."

The output of the second multiplexer 502 provides a selected particular one of the functional input signal and the first and second address values A and B for application to the write address input signal lines AD_WR of the dual-port memory 102D.

The first and second multiplexers 500 and 502 have respective select signal inputs that are adapted to receive respective first and second control signals. The first control signal in this embodiment is determined as a function of a flip signal and a flag signal, and more particularly as an exclusive-or (XOR) of the flip and flag signals.

The flip signal in this embodiment is generated by a flip-flop that is clocked by the clock signal MCLK and has its data input D connected to its inverted data output Q-BAR such that its data output Q continuously toggles between logic "1" and logic "0" levels at successive rising edges of MCLK. The flip signal is an example of what is more generally referred to herein as a "toggle signal," and the circuitry used to generate it is assumed to be implemented in the scan test controller 110. The flag signal is generated using the state machine 114, as will be described in greater detail below in conjunction with FIG. 6.

In the first circuitry 112D-W, the second control signal comprises a scan test mode signal denoted scan_mode that has a first logic level in the scan test mode of operation and a second logic level in the functional mode of operation. More particularly, the scan_mode signal is at a logic "1" level in the scan test mode of operation, and at a logic "0" level in the functional mode of operation.

The second circuitry 112D-R comprises first and second multiplexers 504 and 506, and is configured in substantially the same manner as the first circuitry 112D-W, except that the first and second address values A and B are applied to the opposite inputs of the first multiplexer 504, and the output of the second multiplexer 506 provides a selected particular one of the functional input signal and the first and second address values A and B for application to the read address input signal lines AD_RD of the dual-port memory 102D.

The third circuitry 112S comprises first and second multiplexers 508 and 510, and is configured in substantially the same manner as the first circuitry 112D-W, except that the first control signal applied to the select signal input of the first multiplexer 508 is only the flip signal, and the output of the second multiplexer 510 provides a selected particular one of the functional input signal and the first and second address values A and B for application to the write/read address input signal lines AD_WR_RD of the single-port memory 102S. Accordingly, in the scan test mode of operation, the scan input signal applied to the address input signal lines AD_RD_WR will toggle from one of the address values A and B to the other at each rising edge of the clock signal MCLK.

Although not shown in FIG. 5, additional multiplexers may be incorporated into the interface signal selection circuitry 112 for controlling application of other interface signals to the memory 102. For example, it is assumed that separate multiplexers are provided for controlling each of the MCLK, CS, WE and DATA input signal lines of the memory 102 between functional and scan test modes of operation. A given such multiplexer can be configured to receive a functional input signal and a scan test input signal and to select between those signals utilizing the scan_mode signal.

It is to be appreciated that the particular interface signal selection circuitry described above in conjunction with FIG. 5 is presented by way of example only, and other embodiments can use different arrangements of multiplexers or other circuitry and associated control signals to provide the desired functionality. For example, in other embodiments, at least portions of the scan test controller 110 may be incorporated into the interface signal selection circuitry 112. The term "interface signal selection circuitry" as used herein is therefore intended to be broadly construed, so as to possibly encompass one or more associated controllers that generate control signals.

Also, with reference to the interface signal selection circuitry 112 as particularly illustrated in FIG. 1, such circuitry may be configured to control signals in only a single direction rather than in two directions as illustrated, and there may be one or more signal lines that pass between the memory 102 and the functional logic 104 without passing through the interface signal selection circuitry 112, although any such signal lines are not explicitly shown in the figure.

Figure 6:
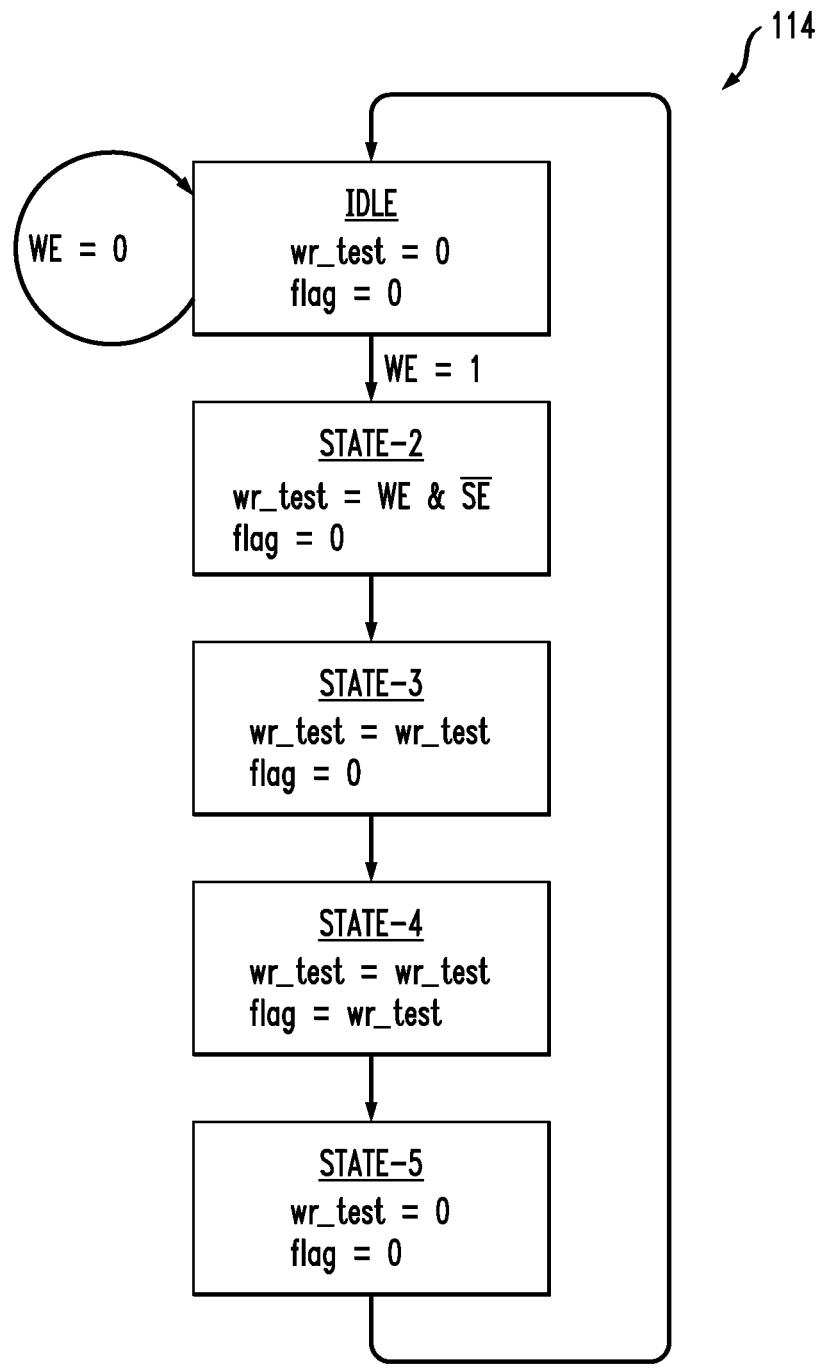
FIG. 6 shows an example of an at-speed scan testing state machine implemented in a scan test controller of the FIG. 1 integrated circuit.

Referring now to FIG. 6, one possible embodiment of the state machine 114 used to generate the flag signal utilized in first and second circuitry 112D-W and 112D-R is shown. In this embodiment, the state machine 114 is configured to monitor the assertion of the write enable signal WE of the dual-port memory 102D. The flag signal generated by the state machine controls whether or not the address value is toggled between A and B in the first multiplexers 500 and 504 of respective interface signal selection circuitry 112D-W and 112D-R in the case of a dual-port memory 102D.

The state machine 114 as illustrated comprises five states, namely, an IDLE state in which the write enable signal WE has a logic "0" level (WE=0) and four additional states denotes STATE-2 through STATE-5 in which the write enable signal WE has a logic "1" level (WE=1). The IDLE state corresponds generally to a scan shift phase of the scan test mode of operation, and STATE-2 through STATE-5 correspond generally to a scan capture phase of the scan test mode of operation. Associated with each of the states of the state machine 114 are the flag signal and an additional signal referred to herein as a write test signal, denoted wr_test, with both signals being initially at the logic "0" level in the IDLE state.

The state machine is assumed to be clocked using the clock signal MCLK, and operates as a modulo-5 counter which starts counting MCLK clock cycles when WE is asserted and stops counting after the count reaches 4 and returns to 0.

The flag signal is initially at a logic "0" level in the IDLE state and remains at that level until the state machine reaches STATE-4. In STATE-4, which corresponds to the modulo-5 counter reaching a count of 3, the flag signal is set to a logic "1" level only if during STATE-2, the write enable signal WE is asserted and the scan enable signal SE is deasserted.

Thus, as indicated in STATE-2, the signal wr_test takes on the result of a logical AND of WE and SE-BAR. It remains at that value through both STATE-3 and STATE-4 as indicated, and in STATE-4 the flag signal is set equal to the value of wr_test as previously determined in STATE-2.

The setting of the wr_test signal to a logic "1" level in STATE-2 indicates that the currently active at-speed scan test is a write test. The wr_test signal will always be at a logic "0" level when the currently active at-speed scan test is a read test, since WE and SE-BAR will not both be simultaneously at logic "1" levels.

The values of the flag and wr_test signals are both set back to the logic "0" level in STATE-5, at which point the state machine returns to the IDLE state. It will remain in the IDLE state as long as the WE signal is at the logic "0" level.

It should be noted that a single state machine 114 can be used to control the generation of a single common flag signal that can be used for at-speed scan testing of interface functional logic associated with multiple memories or other circuit cores of a given integrated circuit. Thus, the state machine need not be replicated for each circuit core of the integrated circuit 101 that is to be subject to at-speed scan testing of its corresponding interface functional logic. For example, the same state machine can be used for both dual-port and single-port memories as well as other types of memories or circuit cores.

Figure 7:
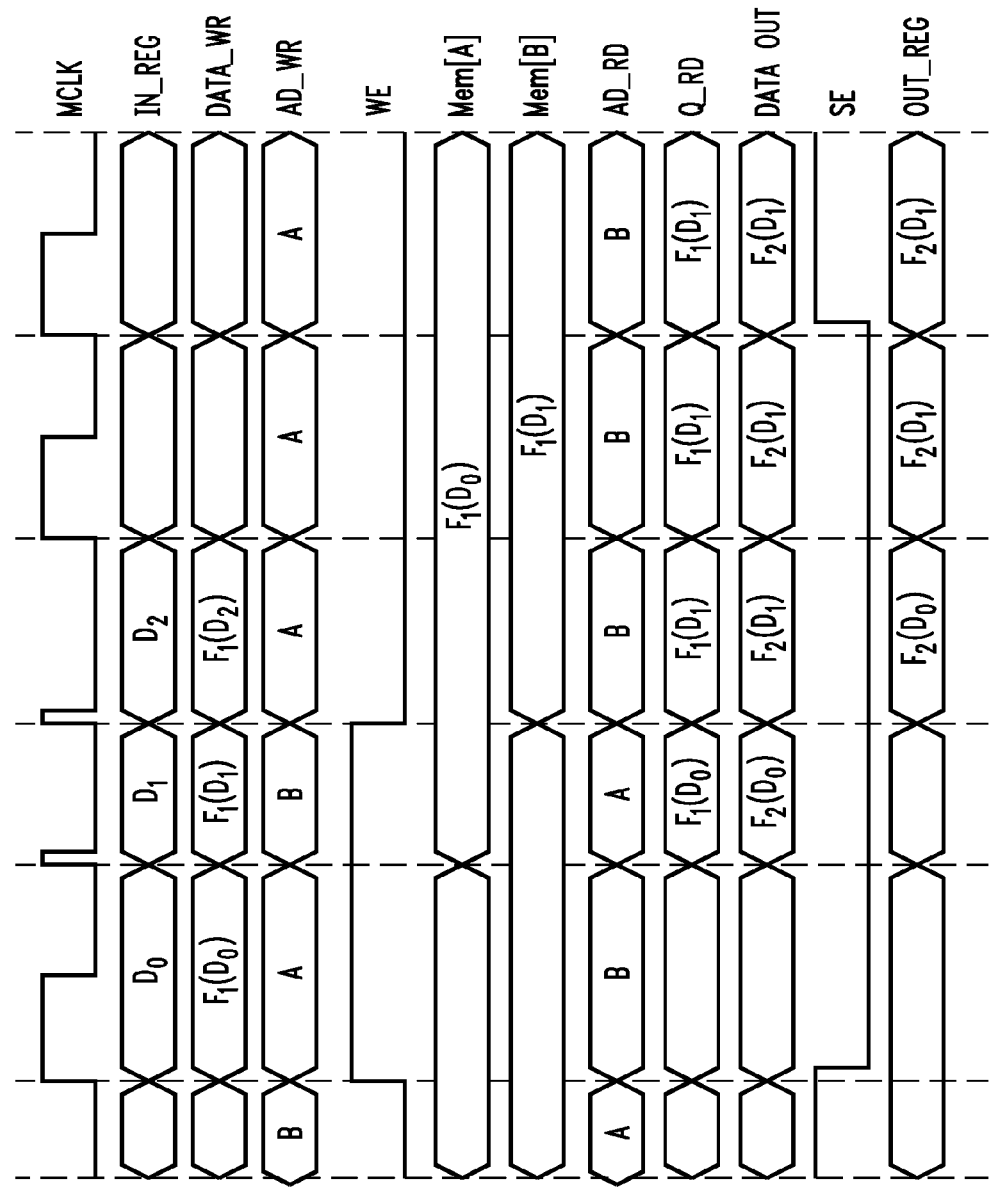
FIGS. 7 through 10 are timing diagrams that illustrate at-speed scan testing of a dual-port write path, a single-port write path, a dual-port read path and a single-port read path, respectively, in the integrated circuit of FIG. 1.
Figure 8:
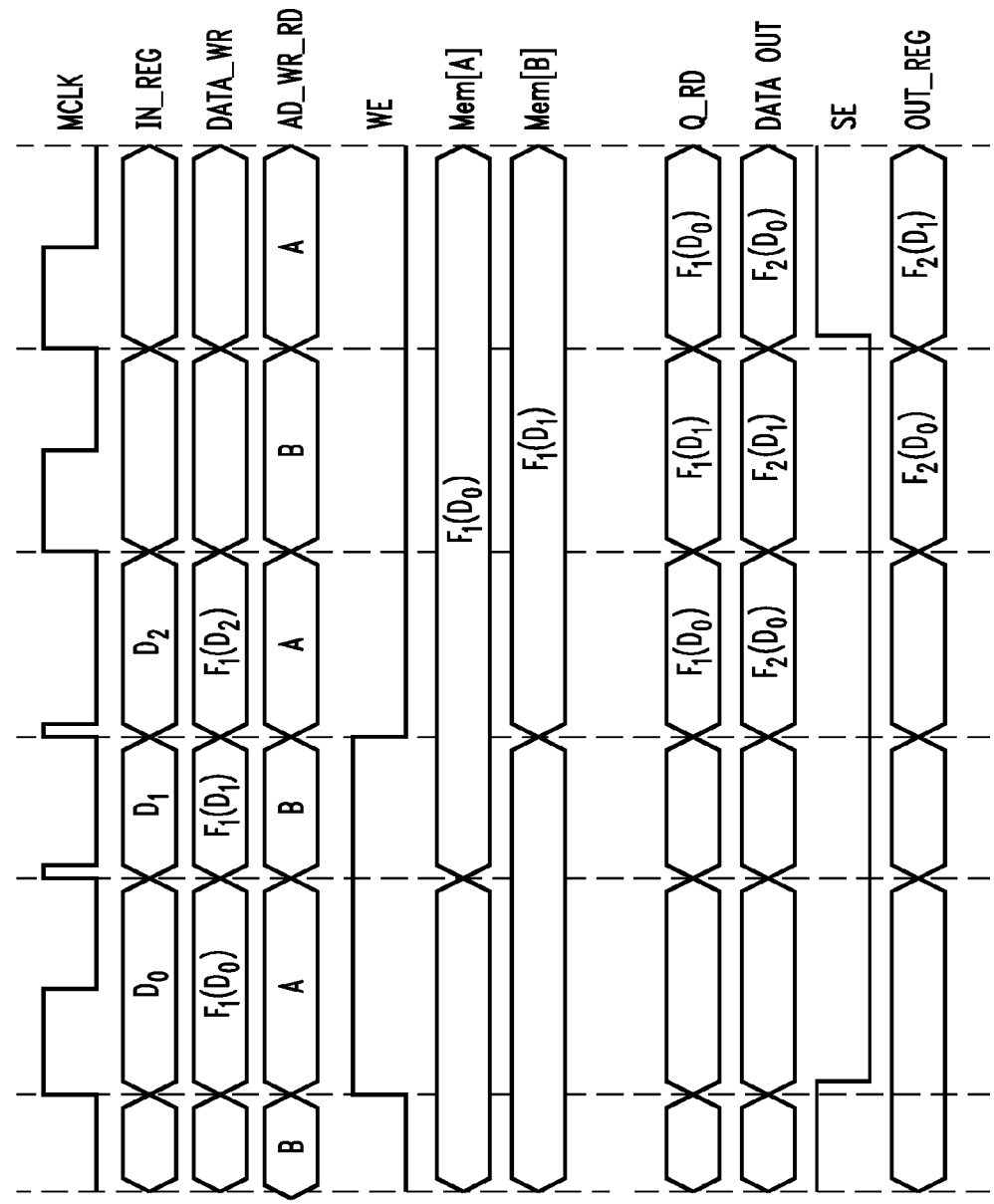

The operation of the scan test circuitry 108, 110 and 112 will now be described in greater detail with reference to the timing diagrams of FIGS. 7-10. FIGS. 7 and 8 more particularly illustrate exemplary at-speed memory write tests for respective dual-port and single-port memories 102D and 102S, and FIGS. 9 and 10 more particularly illustrate exemplary at-speed memory read tests for respective dual-port and single-port memories 102D and 102S. Thus, the at-speed scan testing of the interface functional logic in the present embodiment comprises testing of both a write path and a read path through the memory 102 and its associated interface functional logic.

For at-speed scan testing of the write path, a test pattern from the tester 120 is shifted into the input scan chain 108-1 coupled to the functional logic 104-1, and the associated scan input data is launched on the write path, captured at the write data input of the memory 102, and stored in the memory at a location identified by the selected address value. Additional clock pulses are then used to bring the scan data in memory to the output scan chain from which it can then be shifted out and returned to the tester 120.

For at-speed scan testing of the read path, a test pattern from the tester 120 is shifted into the input scan chain 108-1 coupled to the functional logic 104-1, and the associated scan input data is launched on the write path. Additional clock pulses are then used to store this scan input data in memory. Two sets of data are written in this manner into two separate memory locations. Both sets of data are launched into the read path through the read data output of the memory, one set of data at a time, by separate reads. The data launched into the read path is captured in the output scan chain 108-2 from the functional logic 104-2 and can then be shifted out and returned to the tester 120.

Referring now to FIG. 7, the at-speed scan testing of a write path of the dual-port memory 120D is illustrated. The write path scan testing in this embodiment starts in a scan shift phase as indicated by the scan enable signal SE being at a logic "1" level. This corresponds to the IDLE state of the state machine 114 of FIG. 6. The WE signal is then asserted, which will eventually cause the state machine to transition to STATE-2 as described below. Assertion of the WE signal coincides with deassertion of the SE signal. Accordingly, in STATE-2, the value of the write test signal wr_test is set to a logic "1" level, as both WE and SE-BAR are simultaneously at logic "1" levels, indicating an at-speed memory write test.

Assertion of the WE signal also coincides with a first pulse of MCLK indicating that scan data is present in the input scan chain 108-1 or IN_REG which feeds the functional logic 104-1 coupled to the write data input DATA_WR of the memory 102D. It is assumed that the rising edge of the first pulse of MCLK samples the WE signal as a logic "0" level, such that the state machine at this point remains in the IDLE state and the next pulse of MCLK causes the state machine to transition to STATE-2.

The scan data represented by $D_0$ is transformed by the functional logic 104-1 on the write path into $F_1(D_0)$ and stored responsive to a second pulse of MCLK in the memory location specified by address value A. Similarly, the scan data represented by $D_1$ is transformed by the functional logic 104-1 on the write path into $F_1(D_1)$ and stored responsive to a third pulse of MCLK in the memory location identified by address value B.

These second and third pulses of MCLK cause the state machine to transition to the states STATE-2 and STATE-3, respectively. The fourth pulse of MCLK causes the state machine to transition to the state STATE-4. Prior to entry of STATE-4, the flag signal remains at a logic "0" level and so the address values on AD_WR toggle between A and B as shown. Similarly, the address values on AD_RD toggle between A and B but are one clock cycle out of phase with the address values on AD_WR. In STATE-4, the flag signal is set to the value of wr_test, which is a logic "1" level, such that address values on AD_WR and AD_RD stop toggling between A and B but instead remain at the values prior to the transition in the flag signal, which is A for AD_WR and B for AD_RD. This arrangement ensures that, for example, the data $F_1(D_1)$ from the memory location specified by address B is present at the read output Q_RD and captured by the functional logic 104-2. The data $F_1(D_1)$ is transformed in the functional logic 104-2 to data $F_2(D_1)$ which is captured by the output scan chain 108-1 and subsequently shifted out upon another assertion of the SE signal.

The fifth pulse of MCLK causes the state machine to transition from STATE-4 to STATE-5, which resets the wr_test and flag signals to the logic "0" level. A subsequent pulse of MCLK not shown in FIG. 7 causes the state machine to return to the IDLE state where it will remain until the write enable signal WE is asserted again.

FIG. 8 illustrates the at-speed scan testing of a write path of the single-port memory 120S. The write path scan testing in this embodiment is substantially the same as that previously described in conjunction with FIG. 7 for the dual-port memory 102D, but the address values on the write/read address inputs AD_WR_RD continuously toggle between values A and B responsive to the flip signal without any gating by the flag signal, as apparent from interface signal selection circuitry 112S as shown in FIG. 5.

Figure 9:
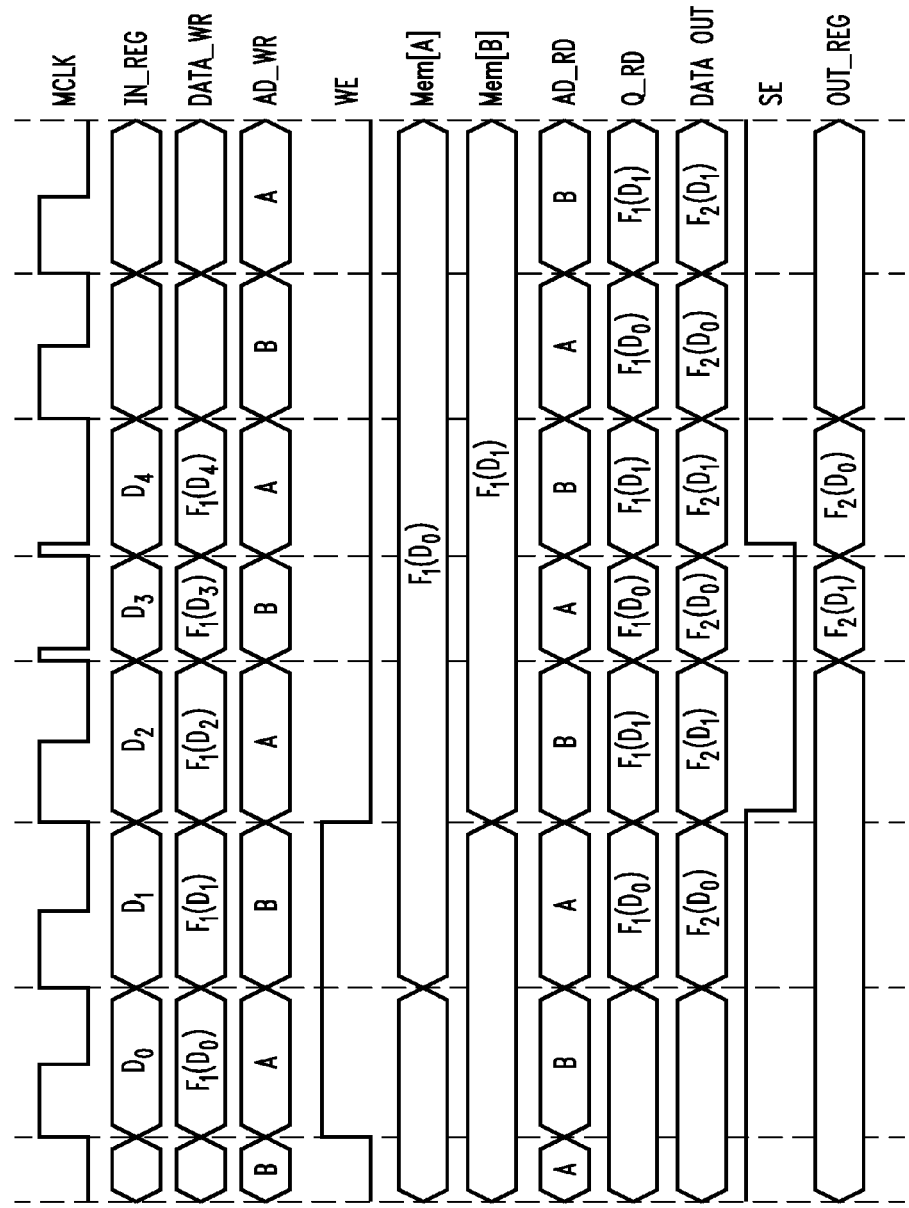

Referring now to FIG. 9, the at-speed scan testing of a read path of the dual-port memory 120D is illustrated. The read path scan testing in this embodiment starts in a scan shift phase as indicated by the scan enable signal SE being at a logic "1" level. This corresponds to the IDLE state of the state machine 114 of FIG. 6. The WE signal is then asserted, which will eventually cause the state machine to transition to STATE-2 as described below. Assertion of the WE signal in this case does not coincide with deassertion of the SE signal, and instead the SE signal remains asserted until after the WE signal is deasserted. Accordingly, in STATE-2, the value of the write test signal wr_test remains at a logic "0" level, as WE and SE-BAR are not simultaneously at logic "1" levels, indicating an at-speed memory read test.

Assertion of the WE signal also coincides with a first pulse of MCLK indicating that scan data is present in the input scan chain 108-1 or IN_REG which feeds the functional logic 104-1 coupled to the write data input DATA_WR of the memory 102D. It is again assumed that the rising edge of the first pulse of MCLK samples the WE signal as a logic "0" level, such that the state machine at this point remains in the IDLE state and the next pulse of MCLK causes the state machine to transition to STATE-2.

The scan data represented by $D_0$ is transformed by the functional logic 104-1 on the write path into $F_1(D_0)$ and stored responsive to a second pulse of MCLK in the memory location specified by address value A. Similarly, the scan data represented by $D_1$ is transformed by the functional logic 104-1 on the write path into $F_1(D_1)$ and stored responsive to a third pulse of MCLK in the memory location identified by address value B.

These second and third pulses of MCLK cause the state machine to transition to the states STATE-2 and STATE-3, respectively. The fourth pulse of MCLK causes the state machine to transition to the state STATE-4. Prior to entry of STATE-4, the flag signal remains at a logic "0" level and so the address values on AD_WR toggle between A and B as shown. Similarly, the address values on AD_RD toggle between A and B but are one clock cycle out of phase with the address values on AD_WR. In STATE-4, the flag signal is set to the value of wr_test, which is a logic "0" level, such that address values on AD_WR and AD_RD continue to toggle between A and B. This arrangement ensures that, for example, the data $F_1(D_0)$ from the memory location specified by address A is present at the read output Q_RD and captured by the functional logic 104-2. The data $F_1(D_0)$ is transformed in the functional logic 104-2 to data $F_2(D_0)$ which is captured by the output scan chain 108-1 and subsequently shifted out upon another assertion of the SE signal.

The fifth pulse of MCLK causes the state machine to transition from STATE-4 to STATE-5, where the wr_test and flag signals remain at the logic "0" level, and the sixth pulse of MCLK causes the state machine to return to the IDLE state where it will remain until the write enable signal WE is asserted again.

Figure 10:
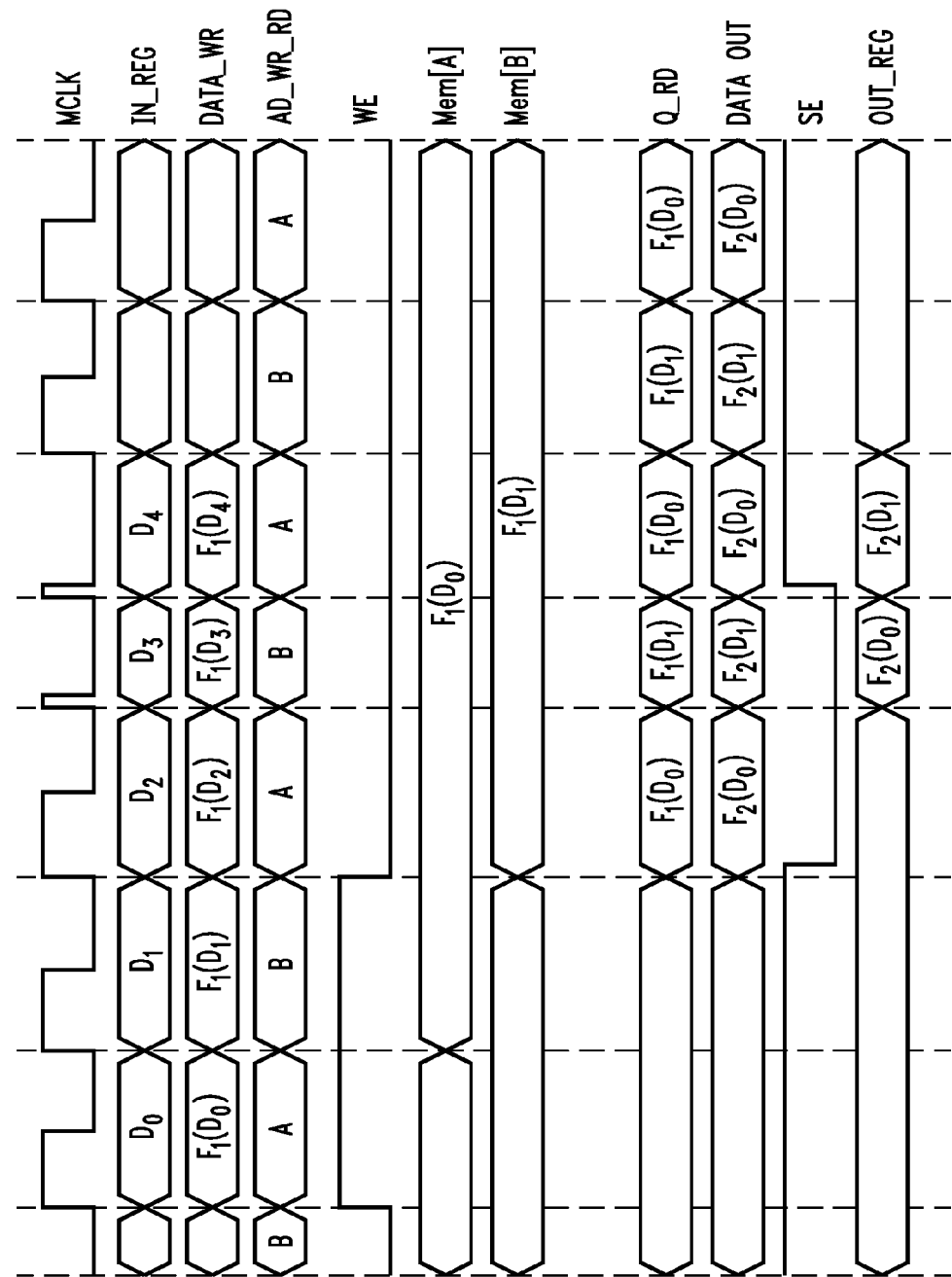

FIG. 10 illustrates the at-speed scan testing of a read path of the single-port memory 120S. The read path scan testing in this embodiment is substantially the same as that previously described in conjunction with FIG. 9 for the dual-port memory 102D, but the address values continuously toggle between values A and B on the write/read address inputs AD_WR_RD of the single-port memory 102S, rather than on separate write and read address inputs AD_WR and AD_RD as in the dual-port memory 102D.

It should be understood that the particular arrangements of circuitry, signals, states, timing and other features of the illustrative embodiments of FIGS. 1 through 10 are presented by way of example only, and other arrangements of features may be used in alternative embodiments. For example, in alternative embodiments the state machine 114 or other portions of the scan test controller 110 in the FIG. 1 embodiment may be implemented off-chip, such as in the tester 120 of the integrated circuit testing system 100.

Accordingly, numerous alternative arrangements of circuit cores, functional logic, scan test circuitry, and possibly additional or alternative elements, may be used to implement the described functionality. This functionality can be implemented in one or more of the embodiments without any significant negative impact on integrated circuit area requirements or functional timing requirements.

The illustrative embodiments allow at-speed scan testing of circuit core interfaces in an integrated circuit that would otherwise not be testable using conventional BIST circuitry. Accordingly, improved fault coverage is provided in testing of integrated circuits without significantly increasing the cost or complexity of these devices. As a result, fault coverage can be provided for functional paths at a circuit core interface without the addition of significant amounts of scan test circuitry. The disclosed techniques are independent of the particular fault models used, and result in efficient generation of test patterns. For example, these techniques are well suited for use with combinational test pattern generators that lack the ability to keep track of the state of the memory during scan shift phases. By using specific address locations of the memory to capture the faults of the incoming paths and to provide the stimulus for the outgoing paths, fewer test patterns are needed.

Figure 11:
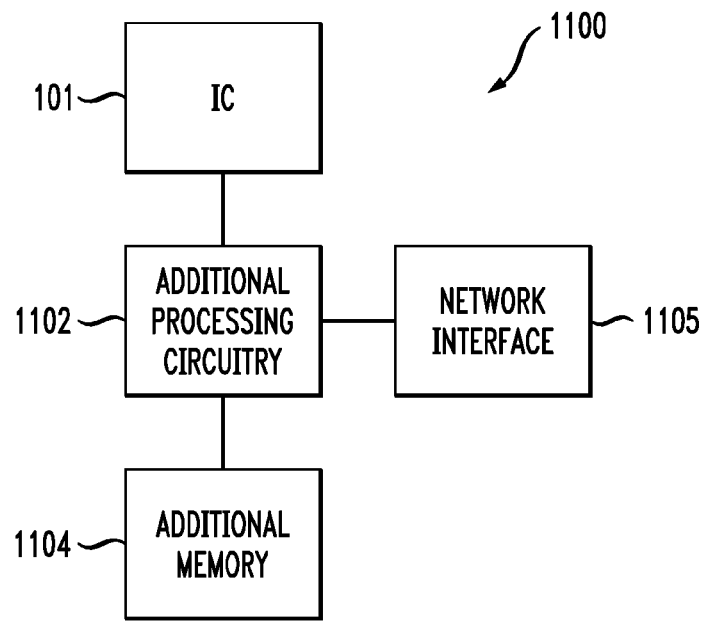
FIG. 11 is a block diagram of an exemplary processing device that incorporates the integrated circuit of FIG. 1.

As indicated previously, the integrated circuit 101 may be incorporated into a computer, server, communication device or other type of processing device. An example of such a processing device is the processing device 1100 shown in FIG. 11. This processing device includes, in addition to integrated circuit 101, processing circuitry 1102 and memory 1104. The processing circuitry 1102 of processing device 1100 may comprise a microprocessor, CPU, ASIC, FPGA or other type of processing device, as well as portions or combinations of such devices. The processing circuitry 1102 is coupled to the memory 1104 and to a network interface 1105. The network interface 1105 permits the processing device 1100 to communicate with other devices and systems over one or more networks, and may therefore comprise, by way of example, one or more conventional transceivers.

The integrated circuit 101 may incorporate and execute software for controlling scan test functionality of the type described herein. Such software may be stored in a memory of the integrated circuit itself, or in additional memory 1104 of associated processing device 1100. These and other memories used to store software may each be viewed as an example of what is more generally referred to herein as a computer-readable medium or other type of computer program product having computer program code embodied therein, and may comprise, for example, electronic memory such as RAM or ROM, multi-level memory, magnetic memory, optical memory, or other types of storage devices in any combination.

The tester 120 in the testing system 100 of FIG. 1 need not take any particular form, and various conventional testing system arrangements can be modified in a straightforward manner to support the scan testing of interface functional logic as disclosed herein. For example, a tester in one embodiment comprises a load board, with an integrated circuit to be subject to scan testing using the techniques disclosed herein being installed in a central portion of the load board. The tester also comprises processor and memory elements for executing stored program code. A given such processor can be used to implement at least a portion of an ATPG or other type of test pattern generator, and associated input and output scan data is stored in the memory. Numerous alternative testers may be used to perform scan testing of an integrated circuit as disclosed herein. Also, as indicated previously, in alternative embodiments at least portions of the tester 120 of the testing system 100 may be incorporated into the integrated circuit itself, as in a BIST arrangement.

Figure 12:
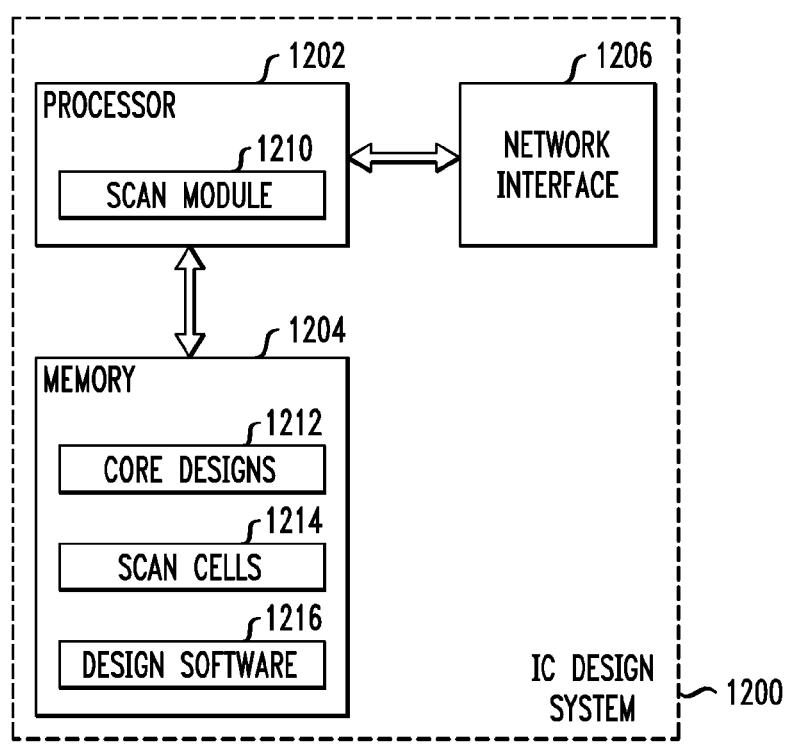
FIG. 12 is a block diagram of a processing system for generating an integrated circuit design comprising scan test circuitry of the type illustrated in FIG. 1.

The insertion of scan chains 108 and other scan test circuitry such as scan test controller 110 and interface signal selection circuitry 112 in a given integrated circuit design may be performed in a processing system 1200 of the type shown in FIG. 12. Such a processing system in this embodiment more particularly comprises a design system configured for use in designing integrated circuits such as integrated circuit 101 to include scan chains 108 and other scan test circuitry for supporting scan testing of interface functional logic 104 associated with the memory 102.

The system 1200 comprises a processor 1202 coupled to a memory 1204. Also coupled to the processor 1202 is a network interface 1206 for permitting the processing system to communicate with other systems and devices over one or more networks. The network interface 1206 may therefore comprise one or more transceivers. The processor 1202 implements a scan module 1210 for supplementing core designs 1212 with scan cells 1214 and other associated scan test circuitry in the manner disclosed herein, in conjunction with utilization of integrated circuit design software 1216.

By way of example, the scan test circuitry comprising scan chains 108, scan test controller 110 and interface signal selection circuitry 112 may be generated in system 1200 using an RTL description and then synthesized to gate level using a specified technology library. A test generation model may then be created for generating test patterns using a test generation tool. Control files or other types of input files may be used to provide the test generation tool with information such as the particular scan cells of one or more scan chains that are associated with particular functional interface signals in a given embodiment. Once the corresponding rules are in place, a rule checker may be run so that the test generation tool has visibility of the scan chains taking into account the operation of the scan test controller 110. Test patterns may then be generated for the scan chain circuitry.

Elements such as 1210, 1212, 1214 and 1216 are implemented at least in part in the form of software stored in memory 1204 and processed by processor 1202. For example, the memory 1204 may store program code that is executed by the processor 1202 to implement particular scan testing functionality of module 1210 within an overall integrated circuit design process. The memory 1204 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 1202 may comprise a microprocessor, CPU, ASIC, FPGA or other type of processing device, as well as portions or combinations of such devices. The memory 1104 of FIG. 11 may be viewed as another illustrative example of a computer program product as the latter term is used herein.

As indicated above, embodiments of the invention may be implemented in the form of integrated circuits. In a given such integrated circuit implementation, identical die are typically formed in a repeated pattern on a surface of a semiconductor wafer. Each die includes scan test circuitry such as scan chains 108, scan test controller 110 and interface signal selection circuitry 112, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

It should again be emphasized that the embodiments of the invention as described herein are intended to be illustrative only. For example, other embodiments of the invention can be implemented using a wide variety of other types of scan test circuitry, with different types and arrangements of scan chains, scan test controllers, interface signal selection circuitry or other scan test circuitry, as well as different types and arrangements of circuit cores, interface functional logic, and associated control signaling, than those included in the embodiments described herein. Also, the particular assumptions made herein in describing the illustrative embodiments should be considered examples only and need not apply in other embodiments. These and numerous other alternative embodiments within the scope of the following claims will be readily apparent to those skilled in the art.

What is claimed is:

1. An integrated circuit comprising:
   scan test circuitry; and
   a circuit core coupled to the scan test circuitry;
   the scan test circuitry comprising:
   input and output scan chains coupled to respective input and output interfaces of the circuit core via respective functional logic blocks; and
   interface signal selection circuitry configured to select a particular one of a functional input signal and a plurality of scan test input signals for application to one or more designated input signal lines of the input interface of the circuit core responsive to one or more control signals;
   wherein first and second scan test input signals of the plurality of scan test input signals comprise respective first and second distinct address values and said one or more designated input signal lines of the input interface of the circuit core comprise a plurality of address input signal lines of an embedded memory of the circuit core of the integrated circuit.

2. The integrated circuit of claim 1 wherein the embedded memory comprises at least one of a dual-port memory and a single-port memory.

3. The integrated circuit of claim 1 wherein the scan test circuitry further comprises a scan test controller coupled to the interface signal selection circuitry and configured to generate at least first and second control signals of said one or more control signals.

4. The integrated circuit of claim 3 wherein the scan test controller comprises a finite state machine configured to generate a flag signal utilized to generate at least one of the first and second control signals.

5. The integrated circuit of claim 4 wherein the finite state machine has a plurality of states including an idle state associated with deassertion of a write enable signal and at least one additional state that is entered when the write enable signal is asserted.

6. A processing device comprising the integrated circuit of claim 1.

7. The integrated circuit of claim 1 wherein the plurality of address input signal lines comprise a read address signal line and a write address signal line, and an address value on each of the read and write address signal lines remains the same over a plurality of cycles of a clock signal.

8. An integrated circuit comprising:
   scan test circuitry; and
   a circuit core coupled to the scan test circuitry;
   the scan test circuitry comprising:
   input and output scan chains coupled to respective input and output interfaces of the circuit core via respective functional logic blocks; and
   interface signal selection circuitry configured to select a particular one of a functional input signal and a plurality of scan test input signals for application to one or more designated input signal lines of the input interface of the circuit core responsive to one or more control signals;
   wherein the interface signal selection circuitry comprises:
   a first multiplexer having a first input adapted to receive a first one of the scan test input signals, a second input adapted to receive a second one of the scan test input signals, and an output; and
   a second multiplexer having a first input coupled to the output of the first multiplexer, a second input adapted to receive the functional input signal, and an output providing the selected particular one of the functional input signal and the first and second scan test input signals for application to said one or more designated input signal lines of the input interface of the circuit core;

wherein the first and second multiplexers further have respective select signal inputs that are adapted to receive respective first and second control signals of said one or more control signals.

9. The integrated circuit of claim 8 wherein the first control signal comprises a toggle signal that causes the first multiplexer to alternate between selection of the first and second scan test input signals over a plurality of cycles of a clock signal.

10. The integrated circuit of claim 8 wherein the first control signal is determined as a function of a toggle signal and a flag signal, where the flag signal prevents the first multiplexer from alternating between selection of the first and second scan test input signals over a plurality of cycles of a clock signal after a designated number of the cycles.

11. The integrated circuit of claim 8 wherein the second control signal comprises a scan test mode signal having a first logic level in a scan test mode of operation and a second logic level in a functional mode of operation.

12. A method of scan testing an integrated circuit, comprising:
providing input and output scan chains coupled to respective input and output interfaces of a circuit core via respective functional logic blocks; and
selecting a particular one of a functional input signal and a plurality of scan test input signals for application to one or more designated input signal lines of the input interface of the circuit core responsive to one or more control signals;
wherein first and second scan test input signals of the plurality of scan test input signals comprise respective first and second distinct address values and said one or more designated input signal lines of the input interface of the circuit core comprise a plurality of address input signal lines of an embedded memory.

13. The method of claim 12 wherein said selecting comprises alternating between selection of the first and second scan test input signals over a plurality of cycles of a clock signal in a scan test mode of operation.

14. The method of claim 13 wherein said selecting further comprises temporarily preventing the alternating between selection of the first and second scan test input signals over the plurality of cycles of the clock signal in the scan test mode of operation after a designated number of the cycles.

15. The method of claim 12 wherein a first control signal of said one or more control signals comprises a toggle signal that causes said selecting to alternate between selection of the first and second scan test input signals over a plurality of cycles of a clock signal in a scan test mode of operation.

16. A computer program product comprising a non-transitory computer-readable storage medium having computer program code embodied therein for use in scan testing an integrated circuit, wherein the computer program code when executed causes the integrated circuit to perform the method of claim 12.

17. The method of claim 12 wherein:
the plurality of address input signal lines comprise a read address signal line and a write address signal line; and
said selecting comprises temporarily preventing alternating between selection of the first and second distinct address values for each of the read and write address signal lines over a plurality of cycles of a clock signal in a scan test mode of operation after a designated number of the cycles.

18. A method of scan testing an integrated circuit, comprising:
providing input and output scan chains coupled to respective input and output interfaces of a circuit core via respective functional logic blocks; and
selecting a particular one of a functional input signal and a plurality of scan test input signals for application to one or more designated input signal lines of the input interface of the circuit core responsive to one or more control signals;
wherein a first control signal of said one or more control signals is generated as a function of a toggle signal and a flag signal, where the flag signal temporarily prevents said selecting from alternating between selection of the first and second scan test input signals over a plurality of cycles of a clock signal in a scan test mode of operation after a designated number of the cycles.

19. A processing system comprising:
a processor; and
a memory coupled to the processor and configured to store information characterizing an integrated circuit design comprising at least one circuit core;
wherein the processing system is configured to provide, within the integrated circuit design, scan test circuitry comprising:
input and output scan chains coupled to respective input and output interfaces of the circuit core via respective functional logic blocks; and
interface signal selection circuitry configured to select a particular one of a functional input signal and a plurality of scan test input signals for application to one or more designated input signal lines of the input interface of the circuit core responsive to one or more control signals;
wherein first and second scan test input signals of the plurality of scan test input signals comprise respective first and second distinct address values and said one or more designated input signal lines of the input interface of the circuit core comprise a plurality of address input signal lines of an embedded memory.

20. The processing system of claim 19 wherein the plurality of address input signal lines comprise a read address signal line and a write address signal line, and an address value on each of the read and write address signal lines remains the same over a plurality of cycles of a clock signal.

* * * * *